(12) United States Patent
Stole

(10) Patent No.: US 7,624,499 B2
(45) Date of Patent: Dec. 1, 2009

(54) FLEXIBLE CIRCUIT HAVING AN INTEGRALLY FORMED BATTERY

(75) Inventor: Scott M. Stole, Waconia, MN (US)

(73) Assignee: HEI, Inc., Victoria, MN (US)

( * ) Notice: Subject to any disclaimer, the term of this patent is extended or adjusted under 35 U.S.C. 154(b) by 0 days.

(21) Appl. No.: 10/789,108

(22) Filed: Feb. 26, 2004

(65) Prior Publication Data

US 2005/0189139 A1 Sep. 1, 2005

(51) Int. Cl.
*H05K 3/30* (2006.01)
*H01M 6/00* (2006.01)

(52) U.S. Cl. .............................. 29/832; 29/825; 29/840; 29/846; 429/127; 429/163

(58) Field of Classification Search .................. 29/825, 29/832, 840, 846; 429/127, 163
See application file for complete search history.

(56) References Cited

U.S. PATENT DOCUMENTS

| | | | | |
|---|---|---|---|---|
| 4,670,664 A | * | 6/1987 | Hara | 307/150 |
| 4,749,875 A | * | 6/1988 | Hara | 307/150 |
| 4,920,019 A | * | 4/1990 | Stoklosa et al. | 429/122 |
| 5,180,645 A | * | 1/1993 | More | 429/127 |
| 5,482,793 A | * | 1/1996 | Burns et al. | 429/62 |
| 5,763,058 A | * | 6/1998 | Isen et al. | 428/209 |
| 6,517,967 B1 | * | 2/2003 | Shrim et al. | 429/148 |
| 2003/0226899 A1 | | 12/2003 | Finkelstein | |

* cited by examiner

*Primary Examiner*—C. J Arbes
(74) *Attorney, Agent, or Firm*—Merchant & Gould P.C.

(57) ABSTRACT

A method and apparatus of forming a battery enabled flexible circuit. The invention includes forming a first insulating layer and positioning a battery on the first insulating layer, the battery having at least a first and a second terminal. A second insulating layer is then formed on the first insulating layer and the battery. The second insulating layer has vias that are in electrical contact with at least one of the first and the second terminals.

22 Claims, 6 Drawing Sheets

FLEXIBLE CIRCUIT HAVING AN INTEGRALLY FORMED BATTERY

TECHNICAL FIELD

The present invention relates to flexible circuits, and more specifically to a flexible circuit having an integrally formed battery.

BACKGROUND

Batteries are a familiar part of everyday life. Many of us depend on heavy lead-acid batteries to start our cars, dry cells to operate cameras, small lithium-iodine batteries to power cardiac pacemakers, and tiny lithium-magnesium oxide coin cells to run watches.

One goal for researchers has been to reduce the size and weight of batteries. Smaller, lighter batteries are needed to keep pace with the reduction in sizes of electronic devices. These smaller batteries are produced to provide electrical energy for a variety of different devices and applications where packaging space is a premium. Examples include computer memory chips, microcircuits, subsystems for hearing and medical applications, communications, and high-speed data processing. For example, thin-film lithium micro batteries have been developed for computer memory chips.

A number of processes are used to develop micro batteries. Solid-state processes are used for forming thin-film batteries and these processes help increase the amount of energy that can be stored in the battery per unit weight and volume. Standard sputtering or evaporation techniques have been used to deposit thin-film components of a battery, e.g., current collectors, cathode, electrolyte, anode, and a protective coating. The thin-film lithium cell, for example, is fabricated by depositing successive layers of the cathode, electrolyte, and anode. When sputtering is used, high voltage causes atoms to be ejected from one metal and electrically deposited as a battery layer on another metallic or nonmetallic surface located in a vacuum. When evaporation is used, a filament of a metal to be deposited is heated by electric current in a vacuum chamber, which makes the filament particles travel to a metallic or non-metallic surface to form a battery layer. The result is a battery that is exceptionally thin (e.g., only 6 microns thick, or one-third the thickness of plastic wrap) and typically having surface areas of 0.5 to 10 cm². However, there is no fundamental limit on these dimensions, either larger or smaller.

The performance characteristics may be determined by the type of cathode material, the area and thickness of the material, and by operating temperature. For applications requiring high discharge rates, crystalline $LiCoO_2$ is an optimum choice, while for low rate applications or those requiring ambient temperature battery fabrications, amorphous $LiMn_2O_4$ may be used. Also, inorganic anode material allows the development of lithium-ion batteries with service temperatures to at least 250° C.

Thin-film lithium micro batteries have been found to have remarkably high specific energies and energy densities. These cells have open circuit voltages at full charge of 3.7 to 3.8 volts, the highest voltage currently achieved in a thin-film battery fabrication. These same fabrication processes have been used to create thin-film batteries that can be deposited either directly on a reverse side of a computer memory chip or onto the chip's protective ceramic package. One possible advantage of these solid-state thin-film batteries include high power and energy densities, having the capability of being recharged, being fabricated to virtually any size, and being bonded onto a variety of substrate material surfaces, such as semiconductors, ceramics, and plastics.

SUMMARY

In general terms, the present invention is a flexible circuit having an integrally formed battery in which the battery is an integral part of a single or multi layer circuit.

One aspect of the present invention is a method of forming a battery enabled flexible circuit, the method includes forming a first insulating layer, positioning at least one battery on the first insulating layer, the at least one battery having at least first and second terminals, and forming a second insulating layer on the first insulating layer and the battery, the first and the second layers forming a flexible circuit board.

Another aspect of the present invention is directed to an apparatus providing at least one battery as an integral part of a circuit, the apparatus including a first insulating layer, at least one battery positioned on the first insulating layer, wherein the at least one battery having at least a first and a second terminal, and a second insulating layer formed on the first insulating layer and the at least one battery, the first and second layers forming a flexible circuit board.

Yet another aspect of the present invention is a processor including a receiving unit for receiving an input signal, a processing unit connected to the input unit for processor the input signal, the processing unit having at least one battery in a circuit including a first insulating layer, at least one battery positioned on the first insulating layer, wherein the at least one battery having at least first and second terminals, a second insulating layer formed on the first insulating layer and the at least one battery, the first and second layers forming a flexible circuit board, and an output, connected to the processing unit, for transmitting a modified input signal.

DETAILED DESCRIPTION

Figure 1:
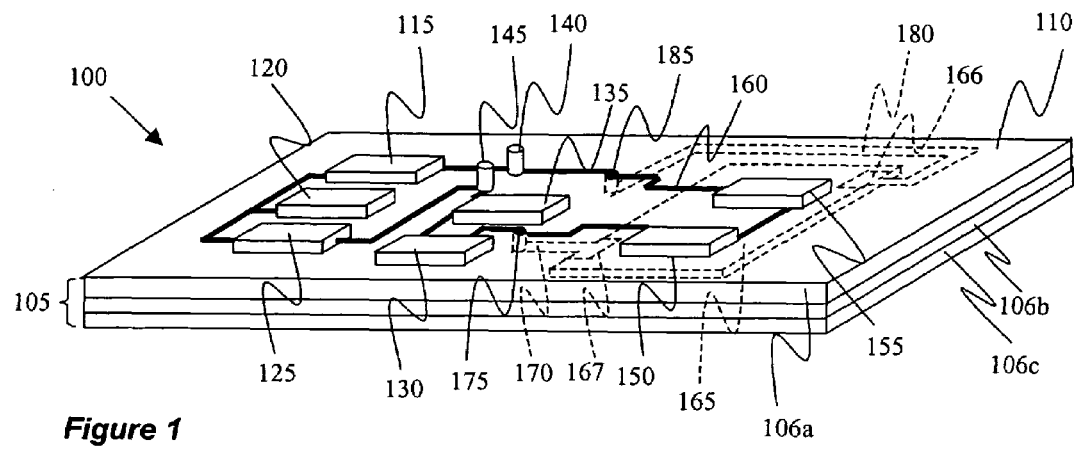
FIG. 1 illustrates one possible embodiment of a circuit having a battery as an integral part of a circuit board according to the present invention.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

FIG. 1 illustrates one possible embodiment of a circuit 100 having a battery as an integral part of a circuit board. In FIG. 1, the circuit 100 includes a circuit board 105, such as a flexible circuit board, formed by one or more layers 106a-c, each layer having associated surfaces (e.g., surface 110). The layers are formed by any appropriate fabrication process. The circuit 100 includes one or more surface-mounted components 115, 120, 125, 130, 135, 140, 145, 150, 155 populating, for example, one surface 110 of the circuit 100. However, the embodiment is not limited to populating only one surface and components can be positioned on other surfaces associated with each layer 106a-c. Additionally, the surface mounted components 115, 120, 125, 130, 135, 140, 145, 150, 155 illustrate only one exemplary embodiment. The circuit 100 can include any combination or type of electrical component, microstrip or conductor. Conductive paths or traces 160 can be formed on the external surface 110 or on one or more of the internal surfaces or the multiple layers 106a-c that form the circuit 100.

During a fabrication process, a battery 165, such as a flexible thin-film battery 165, can be positioned on the circuit board 105. The battery 165 can be positioned by embedding the battery in one or more layers of the circuit board 105, by forming the battery 165 on a surface of the circuit board 105, or by sandwiching the battery between any two layers 106a-c of the circuit board 105. One advantage of positioning a battery 165 as an integral part of a circuit board 105 is that more surface area on the circuit board 105 is available to mount components. Additionally, area required by a target device to house the circuit board 105 is reduced. For example, in one embodiment, a battery 165 is only 6 microns thick and has a surface area of 0.5 to 10 $cm^2$. Hence, a reduction in the dimensions of battery 165 helps reduce the overall size of the circuit board 105 incorporating that battery. However, this embodiment is not limited to these dimensions and the thickness and overall area dimensions can be larger or smaller.

The battery 165 can include at least two terminals. The first terminal can be an anode current collector 166 and the second terminal can be a cathode current collector 167. The anode current collector 166 and the cathode current collector 167 can be electrically connected to, for example, component 115, 120, 125, 130, 135, 140, 145, 150, 155 by through-holes or vias 175, 185. The anode current collector 166 and the cathode current collector 167 can also can be electrically connected to components positioned in other layers 106a-c of the circuit board 105. The anode current collector 166 and the cathode current collector 167 can be connected to vias 185, 175, respectively, by conductive paths 180, 170, respectively, formed in or on a same layer as the anode current collector 166 and cathode current collector 167.

An advantage to having the battery 165 positioned in the flexible circuit board 105 is to allow more surface area for the population of components 115, 120, 125, 130, 135, 140, 145, 150, 155. Further, the battery 165 being positioned in the flexible circuit board 105 allows the overall circuit 100 to become thinner and therefore taking up less space in a target device.

Figure 2:
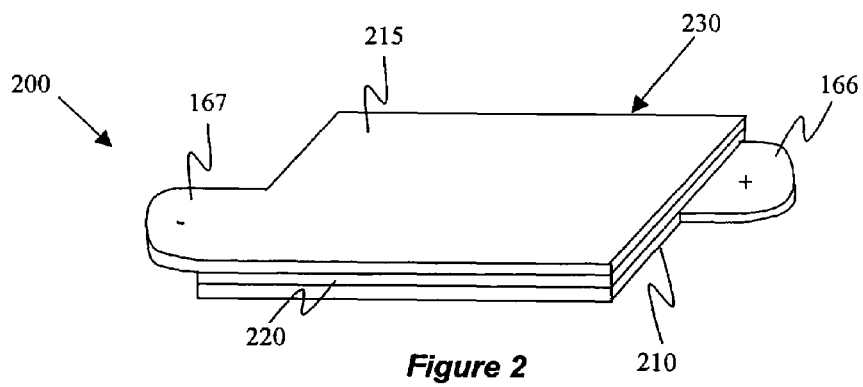
FIG. 2 illustrates one possible embodiment of a battery according to the present invention.

FIG. 2 illustrates one possible embodiment of a battery 200. The battery 200 illustrated in FIG. 2 includes at least two contacts or current collectors, an anode current collector 166 and a cathode current collector 167. The anode current collector 166 is connected to an anode layer 210. The cathode current collector 167 is connected to a cathode layer 215. An electrolyte layer 220 is positioned between the anode layer 210 and the cathode layer 215 to insulate the anode layer 210 from the cathode layer 215.

The battery 200 can be, for example, a rechargeable flexible thin-film battery. However, the embodiment is not limited to flexible thin-film batteries and any suitable composition can be used. For example, in one embodiment, the composition and location of the battery 200 is such that the battery 200 can be recharged using solar energy, inductive coupling, or recharged by any other suitable means. Also, the battery 200 can be customized in any physical size 230 and energy capacity required by the circuit 100 or a system. In one possible embodiment, the battery 200 has a thickness in a range of approximately 5 to 25 microns. One advantage of using the battery 200 having these dimensions is that the battery 200 uses only a small amount of area on the circuit board 105 allowing the circuit board 105 to be smaller and thus can be positioned in locations having limited space.

The battery 200 can be fabricated as a standalone battery-source on a flexible or rigid substrate, fabricated on the circuit or device that it is intended to power, such as on a housing for an integrated circuit, or on the surface of a printed circuit board. The combination of the battery 200 and circuit board 105 can be used in for any number of different applications. For example, the battery 200 and flexible circuit board 105 can be used for portable computing and telephony devices, for storing electricity produced by photovoltaic solar panels, and in integrated circuit packages, and any application in which the circuit may flex or otherwise bend. Moreover, the battery 200 is designed to satisfy applications such as non-volatile SRAMs, real-time clocks, supply supervisors, active RFID tags, and nanotechnology devices, wherein a small, localized, low energy power source is required.

Figure 3:
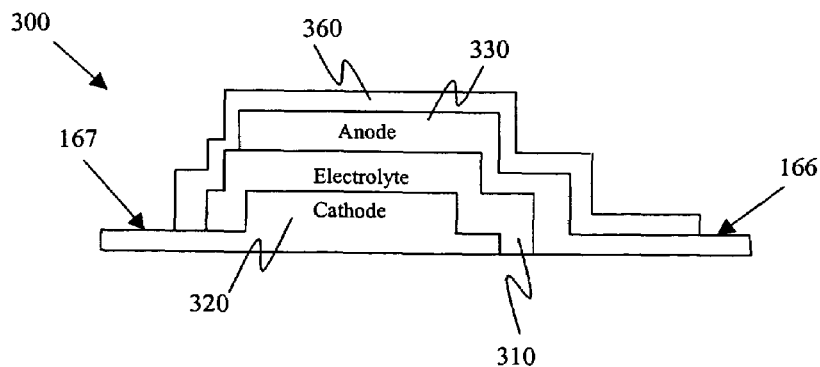
FIG. 3 illustrates a cross-sectional view of a battery substantially similar to that shown in FIG. 2.

FIG. 3 illustrates a cross-sectional view of a battery 300 substantially similar to that shown in FIG. 2. The battery 300 can be fabricated to have any shape provided that an electrolyte 310 completely isolates a cathode 320 from an anode 330. However, any acceptable fabrication process can be used. An anode current collector 166 and a cathode current collector 167 provides electrical connectivity to conductive paths or other devices. The anode and cathode current collectors 166, 167 can be in a same plane as illustrated in FIG. 3 or in different planes as illustrated in FIG. 2. In one possible embodiment, protective coating 360 can be deposited to cover and protect the battery 300, but as to leave a portion of the battery current collectors 166, 167 exposed to provide electrical conductivity and a conductive path.

In one embodiment, the anode 330 is a lithium or lithium-ion anode. The cathode 320 is a mixture of carbon, polyvinyl chloride (PVC), and silver tungstate. The tungstate acts as the lithium acceptor, the carbon provides the electrical conductivity, and the PVC binds everything together. This anode 330 and cathode 320 can then sandwich a polymer electrolyte 310 to produce a complete battery 300. However, the embodiment is not limited to this composition of materials and any suitable composition of material can be used to fabricate the anode 330, cathode 320 and electrolyte 310.

The structure or stacking of the battery components 310, 320, 330 can be accomplished by any acceptable means, such as lamination, sputtering, vacuum deposition, or photolithography using standard techniques. The battery 300 can be fabricated on virtually any solid or resilient substrate such as silicon, alumina, glass, metals, and plastics. However, the substrate is not limited to these materials.

Performance characteristics of the battery 300 are determined by at least the type of anode and cathode material, area and thickness of the material, and by operating temperature. For example, applications requiring high discharge rates can use a crystalline $LiCoO_2$ for the cathode 320 while for low rate applications, or those requiring ambient temperature battery fabrication, amorphous $LiMn_2O_4$ can be used for the cathode 320. Similarly, anode materials such as CoO and $Li_4Ti_5O_{12}$ are used to obtain a high discharge capacity. However, the embodiment is not limited to the above materials, for example, inorganic anode materials can also be used to form the anode 330.

Various applications of the above-mentioned batteries 200, 300 positioned in various circuit board structures will be show with reference to the following embodiments illustrated in FIGS. 4-6.

Figure 4A:
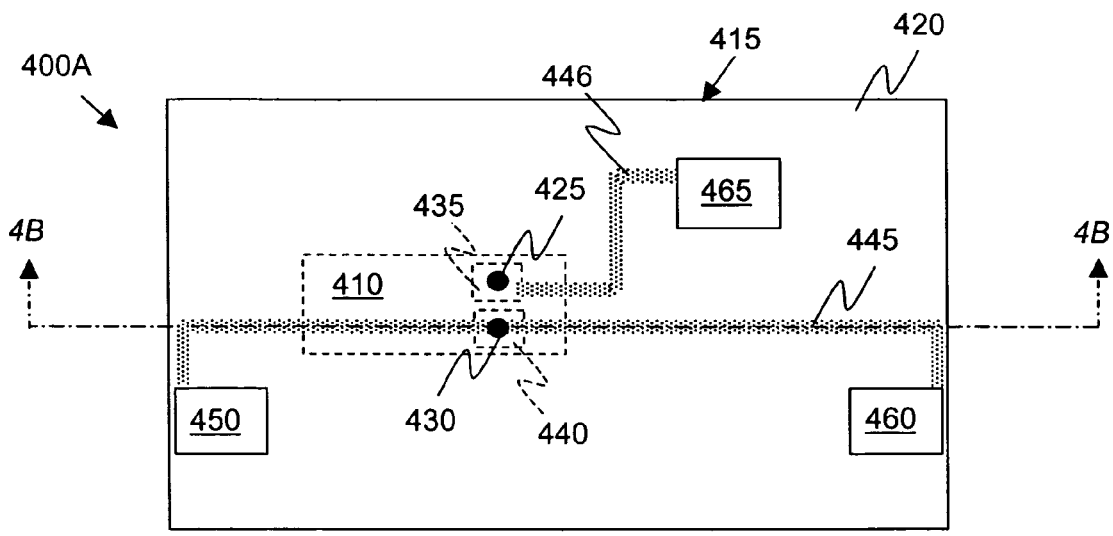
FIG. 4A is a top view of a single battery positioned as an integral part of a circuit according to the present invention.

FIG. 4A is a top view of a single battery positioned as an integral part of a circuit 400A. In the top view, a single battery 410 can be positioned on any layer of a circuit board 415. In one possible embodiment, the battery 410, such as a battery substantially similar to FIG. 3, is positioned on an external surface 420 of the circuit board 415. In another possible embodiment, the battery 410 can be positioned in one or more internal layer of the circuit board 415 as illustrated in the following diagrams.

In one embodiment, components 450, 460, 465 are mounted on the external surface 420 of circuit board 415. In another possible embodiment, the components 450, 460, 465 are mounted or embedded in various layers of the circuit board 415. The components 450, 460, 465 are connected to a cathode current collector 440 and an anode current collector 435 of battery 410 by conductive paths 445, 446, respectively. When components 450, 460, 465 are mounted on the external surface 420 of circuit board 415, and the battery 410 is embedded in an internal layer of circuit board 415, vias 425, 430 provide an electrical path between the anode and cathode current collectors 435, 440 and the conductive paths 446, 445, respectively. However, the above embodiments are not limited to the above path configuration, for example, vias can be formed where necessary to provide conductive paths between anode and cathode current collectors 435, 440 and the conductive paths 446, 445.

Figure 4B:
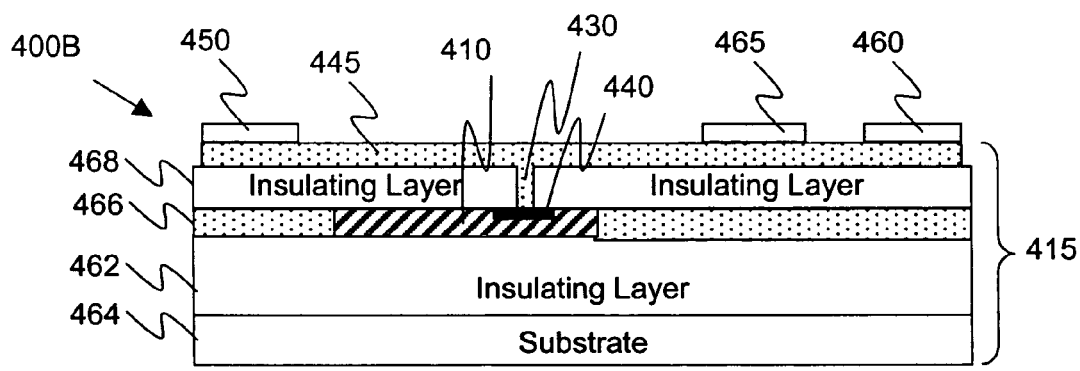
FIG. 4B is a cross-sectional view of the circuit illustrated in FIG. 4A.

FIG. 4B is a cross-sectional view of the circuit illustrated in FIG. 4A. The circuit 400B as shown in FIG. 4B can be fabricated by any acceptable means, such as by lamination or DC magnetron sputter deposition in a presence of an applied magnetic field. An insulating layer 462 formed by one or more layers of an insulating material, such as a polyimide material, is deposited by any acceptable means, such as being sputter deposited or laminated on a substrate 464. The polyimide material may be, for example, ESPANEX or DUPONT KAPTON® brand polyimide. The substrate 464 can be a flexible substrate formed using a semiconductor material or fiberglass material such as ROGERS 4003 brand fiberglass. However, the embodiment is not limited to the above materials or process for forming the insulating layer 462 or the substrate 464.

A conductive layer 466, such as a copper (Cu) layer, is deposited onto the insulating layer 462. The conductive layer 466 can be used to form conductive paths on the surface of the insulating layer 462. The conductive layer 466 provides electrical connectivity between, for example, the anode current collector 435 and/or the cathode current collector 440 of battery 410 and other components on the exterior surface or embedded within the circuit board 415. Next, the battery 410 is positioned on or embedded in the conductive layer 466 in a variety of ways.

In one possible embodiment, the battery 410 is embedded in the conductive layer 466 by removing a portion of the conductive layer 466 large enough to accommodate the battery 410. The portion of the conductive layer 466 is removed by any acceptable means, such as etching or photolithographic techniques. The battery 410 can be formed in the removed portion by any acceptable means, such as lamination, sputter deposition or photolithographic techniques. In another possible embodiment, the battery 410 can be preformed before being embedded in the removed portion of the conductive layer 466.

In another possible embodiment, the battery 410 can be formed on the conductive layer 466 by any acceptable means, such as by lamination, sputter deposition or photolithographic techniques. The battery 410 can also be preformed before being positioned on the conductive layer 466.

A second insulating layer 468 formed by one or more layers of an insulating material, such as a polyimide, is deposited over the conductive layer 466 and the battery 410. Vias 425, 430 are formed in the second insulating layer 468 by any acceptable means, such as ion etching or photolithographic techniques. The vias 425, 430 provide electrical connectivity between a conductive path 446, 445, respectively, and the anode and the cathode current collectors 435, 440, respectively, on the battery 410.

Conductive paths 445, 446 are formed on the second insulating layer 468. In one embodiment, conductive paths 445, 446 are formed by depositing or laminating a second conductive layer on the second insulating layer 468 and etching the conductive paths 445, 446 from the second conductive layer. However, other processes such as photolithography can be used to form conductive paths 445, 446 and any number of additional conductive paths. The conductive paths 445, 446 electrically connect components 450, 460, 465 with the anode current collector 435 and the cathode current collector 440 of battery 410. Also, multiple insulating and conductive layers may be formed throughout the fabrication process as desired, each of the insulating and conductive layers being able to incorporate a battery as described above.

In one possible embodiment of the circuit 400B in FIGS. 4A-B, the material and number of layers used to form the substrate 464, first insulating layer 462, conductive layer 466, second insulating layer 468, second conductive layer 445, and battery 410 allow a flexing of the circuit board 415 for providing a bend radius of approximately 0.5 mm. However, this embodiment is not limited to the number of layers in, for example, FIG. 400B, and fewer or more layers can be removed or added allowing greater or lesser flexibility, respectively, in the circuit board 415.

One advantage of a flexible circuit board 415 is its ability to be folded into a smaller space, or to round a corner. Another advantage is that the flexible circuit board 415 tends to be thinner than conventional printed circuit boards, e.g., 0.02 inches for the flexible circuit board 415 vs. 0.10 inches a standard circuit board. Hence, the thinner flexible circuit board 415 provides more design options for a designer.

In another embodiment, the substrate 464, first insulating layer 462, conductive layer 466, second insulating layer 468, second conductive layer 445 and battery 410 are each formed by combining one or more thinner layers by any acceptable means. For example, laminating together several thinner layers of a conductive material forms the single conductive layer 466. Each one or more layers can be formed to any desired thickness. The addition or subtraction of one or more layers allows the circuit board 415 to flex to a desired degree. In one embodiment, the circuit board 415 is able to flex to a bend radius of approximately 0.5 mm. However, this embodiment is not limited to the number of layers in the one or more layers of circuit board 415, and fewer or more layers can be removed or added allowing greater or lesser flexibility, respectively, in the circuit board 415.

The flexibility of the circuit board 415 allows the circuit to be positioned in various types of devices that flex due to any number of conditions. For example, the circuit board 415 can be placed in a medical device that is implanted in a human body, wherein the location of implantation induces substantial flexing of the circuit board 415. In another embodiment, the circuit board 415 can be placed in a mechanical device. The location where the circuit board 415 is positioned in such a device may be subjected to substantial flexing.

Figure 4C:
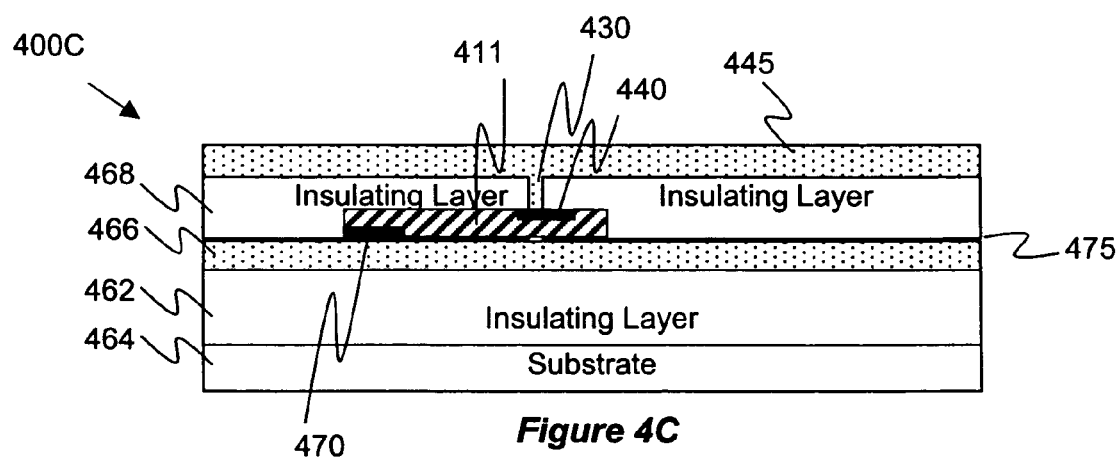
FIG. 4C is a cross-sectional view of an alternate embodiment of a circuit board having an embedded battery.

FIG. 4C is a cross-sectional view of an alternate embodiment of a circuit board having an embedded battery. In one possible embodiment of the circuit 400C, a battery 411 which is substantially similar to the battery illustrated in FIGS. 4A, 4B or FIG. 2 is fabricated on conductive layer 466. In FIG. 4C, the conductive layer 466 is formed as an internal layer of the circuit board 415. The battery 411 has a cathode current collector 470 contacting the conductive layer 466. The conductive layer 466 also forms conductive paths for connecting, for example, the cathode current collector 470 with internal or external components (not shown). The battery 411 also has an anode current collector 440 in electrical contact with via 430. However, the embodiment is not limited to an anode current collector 440 or cathode current collector 470 being positioned as discussed above, and the anode and cathode current collectors 440, 470 can be positioned or formed in any acceptable location.

A third insulating layer 475 can be formed by any acceptable means between the conductive layer 466 and the battery 411. The third insulating layer 475 prevents shorting between the battery 411 and the conductive layer 466 while allowing electrical contact between the cathode current collector 470 and the conductive layer 466.

Figure 4D:
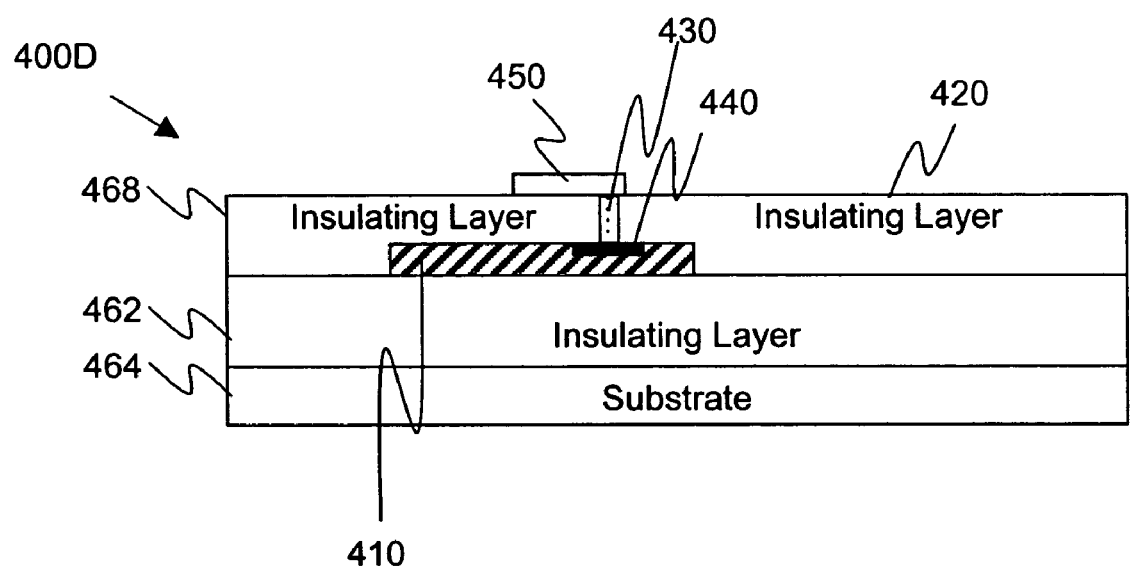
FIG. 4D is another cross-sectional view of an alternate embodiment of a circuit board having an embedded battery.

FIG. 4D is another cross-sectional view of an alternate embodiment of a circuit board having an embedded battery. The circuit 400D as shown in FIG. 4D is fabricated by any acceptable means. In one embodiment, an insulating layer 462, such as a polyimide, is deposited by any acceptable means, such as being laminated or sputter deposited on a substrate 464. The substrate 464 is a flexible substrate formed by a semi-conductor material or a fiberglass material. However, the embodiment is not limited to the above materials or process for forming the insulating layer 462 or the substrate 464.

A battery 410 is positioned on the insulating layer 462. The battery 410 can be preformed or formed by any acceptable means, such as lamination, sputter deposition or photolithographic techniques as discussed above. A second insulating layer 468, such as a polyimide, is deposited over the insulating layer 462 and the battery 410. Both vias 425, 430 (FIG. 4A) are formed in the second insulating layer 468 by any acceptable means, such as ion etching or photolithographic techniques. The vias 425, 430 provide electrical connectivity between the anode and the cathode current collectors 435, 440 (FIG. 4A) on the battery 410 and various components, such as component 450 mounted on the external surface 420 or any other layer of the circuit board 400D. However, the embodiment is not limited to the number of insulating 462, 468 layers, and any number of insulating layers may be formed throughout the fabrication process as desired, each of the insulating layers being able to incorporate any number batteries.

Figure 5A:
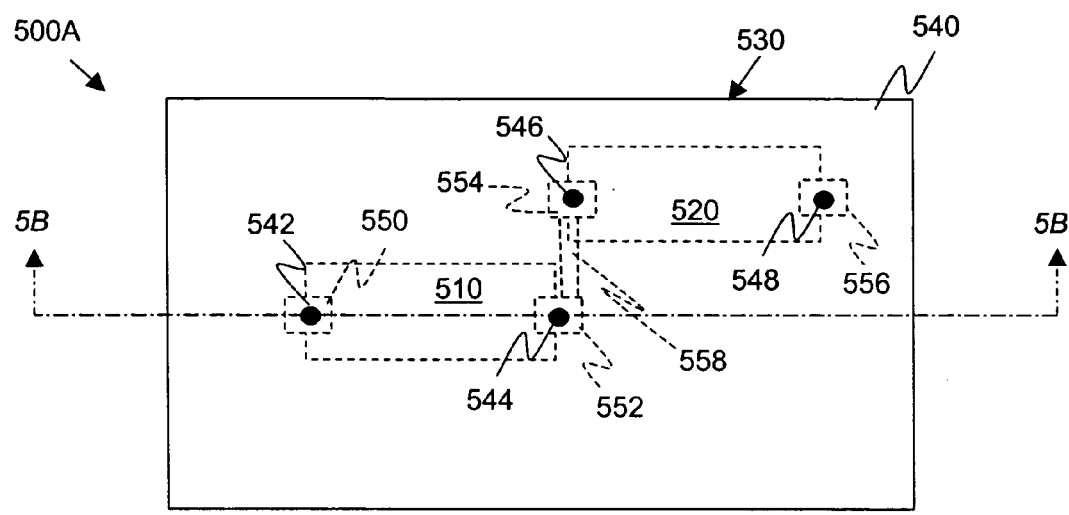
FIG. 5A is a top view illustrating multiple batteries positioned as an integral part of a single layer of a circuit according to the present invention.

FIG. 5A is a top view illustrating multiple batteries positioned as an integral part of a single layer of a circuit board. In the top view of circuit 500A, multiple batteries 510, 520 are positioned on or embedded in any layer of the circuit board 530 as discussed above. In one possible embodiment, the batteries 510, 520 are positioned on an external surface 540 of the circuit board 530 and/or on one or more internal layers of circuit board 530.

Vias or through-holes 542, 546 are formed to electrically connect anode current collectors 550, 554, respectively, of the batteries 510, 520, respectively, to conductive paths formed on the external surface 540 and/or in internal layer of the circuit board 530. Similarly, vias 544, 548 are formed to electrically connect cathode current collectors 552, 556, respectively, of the batteries 510, 520, respectively, to conductive paths formed on the external surface 540 and/or in internal layer of the circuit board 530. In FIG. 5A, vias 546, 544 electrically connect the anode current collector 554 of battery 520 and cathode current collectors 552 of battery 510, respectively, to a conductive path 558 formed at one or more internal layers of the circuit board 530. However, vias 542, 548 are also used to establish connectivity of anode current collector 550 and cathode current collector 556, respectively, with various components (not shown). For example, surface mounted components (not shown) or components embedded in various layers of circuit board 530 (not shown) can be electrically connected to the vias 542, 544, 546, 548.

Figure 5B:
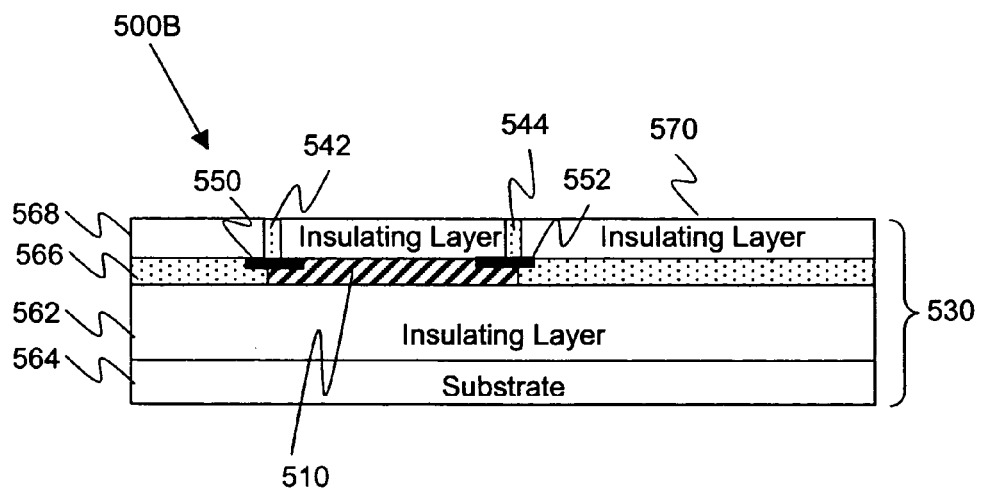
FIG. 5B is a cross-sectional view of the circuit illustrated in FIG. 5A.

FIG. 5B is a cross-sectional view of the circuit illustrated in FIG. 5A. As discussed above, the circuit 500B as shown in FIG. 5B can be fabricated by any acceptable means, such as lamination, DC magnetron sputter deposition in a presence of an applied magnetic field. Ann insulating layer 562, such as a polyimide, is deposited by any acceptable means, such as being laminated or sputter deposited on a substrate 564. However, the embodiment is not limited to the above materials and processes for forming the insulating layer 562 and the substrate 564.

A conductive layer 566, such as a copper (Cu) layer, is deposited onto the insulating layer 562. The conductive layer 566 is used to form conductive paths on the surface of an insulating layer 562. Next, batteries 510, 520 are positioned on or embedded in the conductive layer 566 in a variety of ways as discussed above. For example, in one possible embodiment the anode current collector 554 is electrically connected to the cathode current collector 552 by a conductive path 558 creating multiple batteries connected in series. However, the embodiment is not limited to this configuration, and other connective paths are possible.

A second insulating layer 568 is formed over the conductive layer 566 and the batteries 510, 520. Vias 542, 544, 546, 548 are formed in the second insulating layer 568 by any acceptable means, such as ion etching or photolithographic techniques. In FIG. 5B, the vias 542, 546 provide electrical connectivity between conductive paths (not shown) formed on the external surface 540 of circuit board 530 and the anode current collectors 550, 554, respectively, of the batteries 510, 520, respectively. Similarly, the vias 544, 548 provide electrical connectivity between conductive paths (not shown) on the external surface 540 of circuit board 530, and the cathode current collectors 552, 556, respectively, of the batteries 510, 520, respectively. At least a second conductive layer can be formed on the surface 570 of the second insulating layer 568 to forms additional conductive paths. However, the embodiment is not limited to the number of insulating 568 and conductive 566 layers, and any number of insulating and conductive layers may be formed throughout the fabrication process as desired, each of the insulating and conductive layers being able to incorporate any number batteries.

Figure 6A:
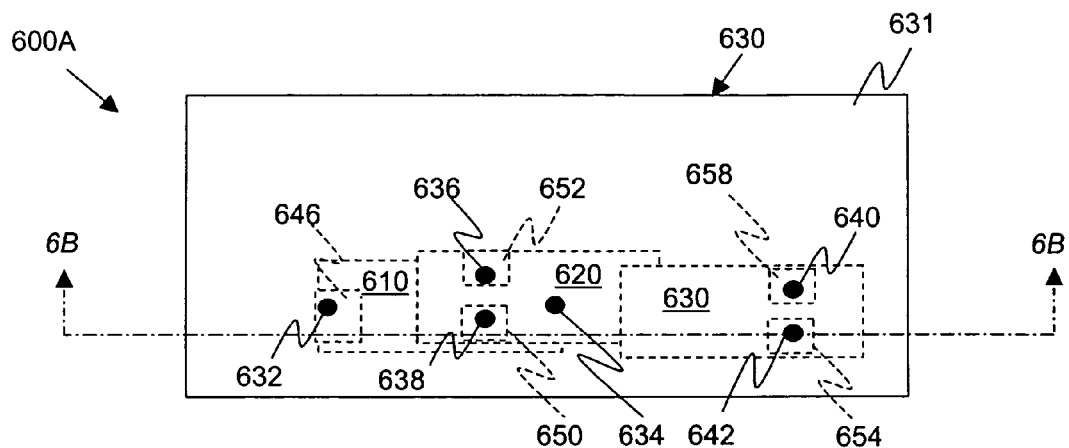
FIG. 6A illustrates a top view of multiple batteries positioned in multiple layers of a circuit according to the present invention.

FIG. 6A illustrates a top view of multiple batteries positioned in multiple layers of a circuit 600A. In the top view, multiple batteries 610, 620, 630 are each positioned on a separate layer of the circuit board 630. One or more batteries 610, 620, 630 can be positioned on or embedded in an external surface 631 of the circuit board 630 or on one or more internal layers of the circuit board 630. Vias or through-holes 632, 638, 642 are formed to electrically connect anodes current collectors 646, 650, 654, respectively, of the batteries 610, 620, 630, respectively, to conductive paths formed on the external surface 631 or conductive paths formed at one or more internal layers or circuit board 630. Similarly, vias or through-holes 634, 636, 640 are formed to electrically connect cathodes 648 (FIG. 6B), 652, 658, respectively, of the batteries 610, 620, 630, respectively, to conductive paths formed on the external surface 631 or conductive paths formed at one or more internal layers of the circuit board 630. Surface mounted components (not shown) or components embedded in various layers of circuit board 630 (not shown) can be connected to the vias 632, 634, 636, 638, 640, 642. However, the embodiment is not limited to the number of insulating and conductive layers, and any number of insulating and conductive layers may be formed throughout the fabrication process as desired, each of the insulating and conductive layers being able to incorporate any number batteries.

Figure 6B:
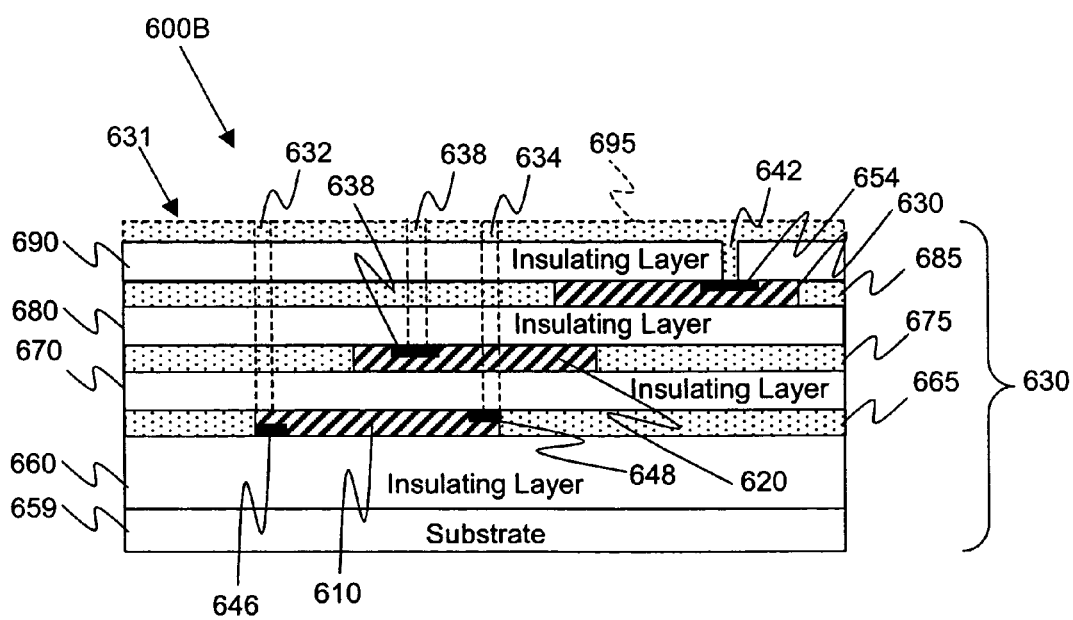
FIG. 6B is a cross-sectional view of the circuit illustrated in FIG. 6A.

FIG. 6B is a cross-sectional view of the circuit illustrated in FIG. 6A. In the circuit 600B of FIG. 6B, a substrate 659 supports multiple insulator/conductive layers 660/665, 670/675, 680/685, wherein at least one battery 610, 620, 630 is positioned on a respective conductive layer. The batteries 610, 620, 630 are positioned on their respective conductive layer 665, 675, 685 in a variety of ways as discussed above.

At least one additional insulator/conductive layer 690/695 can be formed. Vias or through-holes 632, 634, 636, 638, 640, 642 are then formed. The vias 632, 638, 642 connect the external surface 631 or any conductive layer 665, 675, 685, respectively, with any anode current collector 646, 650, 654, respectively, of the batteries 610, 620, 630 formed on or embedded in one or more layers of the circuit board 630. Similarly, vias 634, 636, 640 connect the external surface 631 or any conductive layer 665, 675, 685 with any cathode 648, 652, 658 current collector, respectively, of the batteries 610, 620, 630, respectively, formed at one or more layers of the circuit board 630. Accordingly, the vias can connect multiple anodes 646, 650, 654 and/or multiple cathodes 648, 652, 658 or any combination thereof. For example, the anodes current collectors 646, 650, 654 and cathodes current collectors 648, 652, 658 can be connected as to create multiple batteries connected in series. However, the embodiment is not limited to this configuration, for example, a parallel configuration can also be formed.

Figure 7:
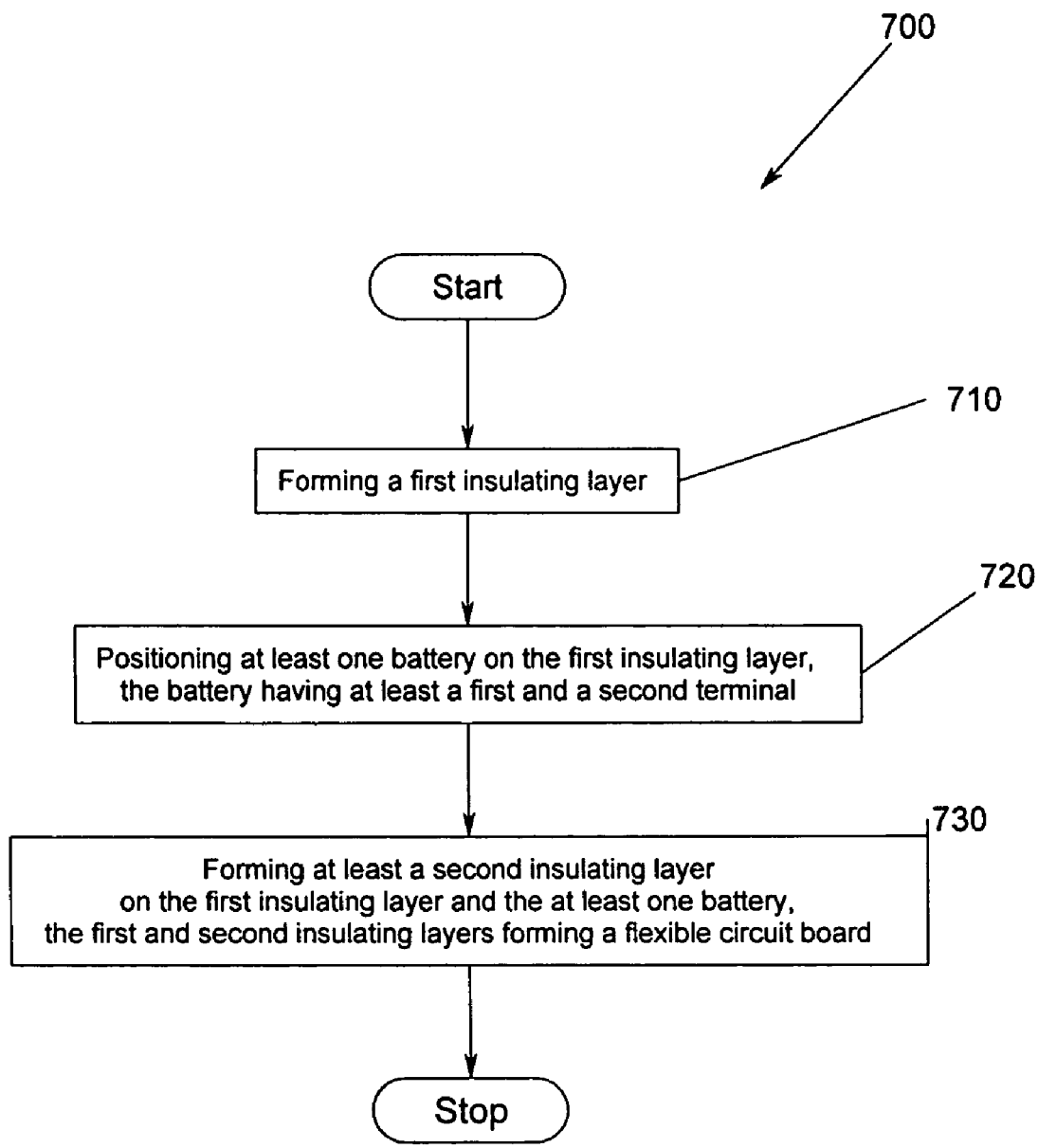
FIG. 7 is a flow chart illustrating the formation of one embodiment of a battery enabled flexible circuit according to the present invention.

FIG. 7 is a flow chart 700 illustrating the formation of one embodiment of a battery enabled flexible circuit. In the formation of a battery enabled flexible circuit, a first insulating layer is formed. The first insulating layer is formed on a substrate such as any suitable semiconductor material or fiberglass material 710.

At least one battery is positioned on the first insulating layer. The battery has at least first and second terminals 720. However the embodiment is not limited to at least one battery having only a first and second terminal and additional terminals can be formed as required. A second insulating layer is then formed on the first insulating layer and the battery. However the embodiment is not limited to only a second insulating layer and multiple insulating/conducting layers can be formed. The first and second insulating layer form a flexible circuit board 730. Vias are formed through the second insulating layer to connect an anode and a cathode of the battery positioned to components mounted on an external surface of the circuit board, or to components embedded within one or more internal layers of the circuit board.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

The claimed invention is:

1. A method of forming a battery enabled flexible circuit, the method comprising:
   forming a first insulating layer;
   positioning at least one battery on the first insulating layer, the at least one battery having at least first and second terminals;
   forming a second insulating layer on the first insulating layer and the at least one battery, the first and second insulating layers forming a flexible circuit board; and
   positioning a circuit component on the second insulating layer opposing the at least one battery.

2. The method of claim 1 further comprising:
   forming a conductive layer on the first insulating layer for providing at least first and second conductive paths, wherein at least one of the first and second terminals of the at least one battery is in electrical contact with at least one of the first and second conductive paths respectively; and
   forming vias in the second insulating layer, the vias being in electrical contact with at least one of the first and second terminals.

3. The method of claim 2, wherein the forming the conductive layer further comprises forming a conductive layer including copper or a copper alloy.

4. The method of claim 1, wherein positioning the at least one battery further comprises forming the at least one battery on the first insulating layer using a lamination process.

5. The method of claim 1, wherein positioning the at least one battery further comprises forming the at least one battery on the first insulating layer using a semiconductor fabrication process, wherein the semiconductor fabrication process is at least one of a process selected from the group comprising deposition, epitaxy, etch, lithography, and anneal.

6. The method of claim 1, wherein positioning the at least one battery further comprises removing a portion of the first insulating layer for embedding the at least one battery therein.

7. The method of claim 6, wherein embedding the at least one battery further comprises positioning the at least one battery in the removed portion using a lamination process.

8. The method of claim 6, wherein embedding the at least one battery further comprises forming the at least one battery in the removed portion using a semiconductor fabrication process, wherein the semiconductor fabrication process is at least one of a process selected from the group comprising deposition, epitaxy, etch, lithography, and anneal.

9. The method of claim 6, wherein embedding the at least one battery further comprises embedding a preformed flexible battery in the removed portion.

10. The method of claim 1 further comprising forming the at least one battery on the second insulating layer.

11. The method of claim 1, wherein the forming the first and second insulating layers further comprises forming the first and second insulating layers using a resilient material.

12. The method of claim 1, wherein forming the first and second insulating layers further comprises forming the first and second insulating layers using a lamination process.

13. The method of claim 12 further comprising forming the first and/or second insulating layer using a polyimide material.

14. The method of claim 1, wherein forming the first and second insulating layers further comprises forming the first and second insulating layers using sputter deposition of a polyimide material.

15. The method of claim 1, wherein forming the first and second insulating layers further comprises forming the first and second insulating layers using chemical vapor deposition of a polyimide material.

16. The method of claim 1 further comprising forming the first and second insulating layers on a flexible substrate formed using a semiconductor or fiberglass material.

17. The method of claim 1 further comprising forming electrical components on the second insulating layer.

18. The method of claim 1, wherein the positioning the at least one battery further comprises positioning a thin-film flexible battery.

19. The method of claim 2 further comprising removing a portion of the conductive layer using a semiconductor fabrication process and embedding a flexible battery therein.

20. The method of claim 19, wherein the using the semiconductor fabrication process further comprises etching.

21. The method of claim 1 further comprising positioning a plurality of batteries in a single conductive layer.

22. The method of claim 1 further comprising positioning at least one battery in each of a plurality of insulating and conductive layers for providing multiple power sources.

* * * * *